United States Patent [19]

Malaviya

[11] 4,396,999
[45] Aug. 2, 1983

[54] TUNNELING TRANSISTOR MEMORY CELL

[75] Inventor: Shashi D. Malaviya, Fishkill, N.Y.

[73] Assignee: International Business Machines Corporation, Armonk, N.Y.

[21] Appl. No.: 279,282

[22] Filed: Jun. 30, 1981

[51] Int. Cl.³ .......................................... G11C 11/40
[52] U.S. Cl. .................................. 365/159; 365/175; 307/286
[58] Field of Search ............. 365/105, 159, 174, 175, 365/177, 179, 189; 307/238.7, 286, 322; 357/12, 13

[56] References Cited

U.S. PATENT DOCUMENTS 3,943,554 3/1976 Russell et al. .................... 357/34

OTHER PUBLICATIONS

IBM Technical Disclosure Bulletin, vol. 23, No. 1, Jun. 1980, pp. 191-193, to C. G. Jambotkar, "Tunnel Diodes as Memory Elements".
IBM Technical Disclosure Bulletin, vol. 23, No. 1, Jun. 1980, pp. 165-166, to W. K. Chu et al., "Tunneling Junction Bipolar Transistors . . . Epi Process".
IBM Technical Disclosure Bulletin, vol. 23, No. 2, Jul. 1980, p. 587 to S. D. Malaviya et al., "Solid-State Epitaxial Process . . . Bipolar Devices".

Primary Examiner—Joseph A. Popek
Attorney, Agent, or Firm—Mitchell S. Bigel

[57] ABSTRACT

A two state memory cell includes a bipolar transistor and a tunnel diode shunted across the base-collector junction thereof. A constant operating current is established through the transistor and the tunnel diode. The voltage across the tunnel diode may thus be maintained at one of two stable levels, while the bipolar transistor is kept on regardless of the tunnel diode voltage, which determines the ZERO or ONE state of the cell. Since the transistor is not switched on and off when the memory state (corresponding to the two tunnel diode voltage levels) changes, memory cell switching speed is not degraded by transistor switching delay. Moreover, since the current in the tunnel diode is maintained constant, preferably at a value midway between the tunnel diode peak and valley currents, the noise margin of the memory cell is enhanced and the possibility of false switching reduced. The tunnel diode/bipolar transistor combination may be formed on a semiconductor substrate as an integrated structure, thereby providing a high density memory cell.

13 Claims, 7 Drawing Figures

ID Jones[4,396,999]

TUNNELING TRANSISTOR MEMORY CELL

DESCRIPTION

Technical Field

This invention generally relates to solid state memory cells and more particularly to a memory cell including a transistor and a tunnel diode integrally formed therewith.

The tunneling phenomenon, as embodied in the tunnel diode, is well known to those having skill in the semiconductor art. Briefly, tunneling is the quantum-mechanical mechanism by which a particle penetrates a barrier, having a barrier height higher than the particle energy, by tunneling under the barrier. Physically, the requirement for tunneling is a highly doped, very abrupt PN junction, so that a large number of electrons are separated from a large number of empty states by a narrow barrier of finite height.

A PN junction having the requirements specified above is known as a tunnel diode. FIG. 1 depicts typical current versus voltage characteristics of a tunnel diode. As will be seen from FIG. 1, the tunnel diode exhibits an N-shaped current versus voltage characteristic. The tunnel diode current exhibits a peak current $I_p$ corresponding to a peak voltage $V_p$. When the current is increased beyond $I_p$ the tunnel diode exhibits an unstable region of negative resistance until the current drops to its valley value, $I_v$, corresponding to a voltage valley, $V_v$. From the above described characteristics it will be seen that at a given operating current $I_{op}$, having a value between the valley current $I_v$ and peak current $I_p$, the tunnel diode is a bistable device. The tunnel diode will exist in one of two stable voltage states $V_h$ or $V_l$.

The tunnel diode, being a bistable device, is eminently suitable for a digital memory wherein one of two logical states may be stored. Further, since the tunnel diode does not have to overcome charge storage limitations of a conventional PN junction, switching between the two stable voltage states $V_h$ and $V_l$ may occur rapidly. High speed switching is, of course, of paramount importance in the design of a digital memory.

Background Art

Since the tunnel diode exhibits two essential characteristics for a memory, i.e., two stable states, and high speed switching therebetween, many attempts have been made to employ a tunnel diode as a memory element. However, all of the prior attempts contain shortcomings which at least partially negate the advantages obtained by employing a tunnel diode.

Attempts have been made to use a tunnel diode, standing alone, as a memory cell. Since, the tunnel diode is a two terminal device, it is difficult to address, read, and write into such a memory cell over separate lines as is desirable for large arrays of memory cells. Standing alone, the tunnel diode, like other two terminal devices, is limited in its applicability as a memory cell.

A three terminal memory cell employing a tunnel diode across the base-emitter junction of a bipolar transistor is disclosed in U.S. Pat. No. 3,943,554, to Russell et al. The tunnel diode is integrally formed with the bipolar transistor, i.e., it requires no additional chip area over the single transistor. Memory density is thus increased compared to a conventional cross coupled flip-flop memory cell arrangement employing two transistors as a minimum.

Unfortunately, the Russell et al memory cell suffers two major disadvantages which offset the expected gains achieved in employing a tunnel diode. First, since the Russell tunnel diode is connected across the base-emitter junction of a bipolar transistor, the bipolar transistor switches on and off as the tunnel diode switches state. That is, when the tunnel diode is in its low voltage state the transistor is turned off, while when the tunnel diode is in its high voltage state the transistor is turned on. Thus, any advantage attained due to the high speed switching characteristics of the tunnel diode is partly negated by the fact that the bipolar transistor (a much slower device) must be switched on and off with each memory state change. The overall speed of the memory cell is therefore decreased. Moreover, since the transistor must be switched on and off, the memory driver/decoder circuits must be able to provide the requisite current for switching the transistor.

A further result of the switching of the bipolar transistor in the Russell et al memory cell is that the current in the tunnel diode varies from a high value close to $I_p$ to a low value close to $I_v$ as the associated transistor is switched on and off. Since the current in the tunnel diode approaches its unstable points $I_p$ and $I_v$, the possibility of false switching by noise or other unwanted phenomena is increased. The possibility of false switching is compounded by the tunnel diode's poor peak to valley ratio $I_p/I_v$. The noise margin of the resultant memory cell is thus highly degraded, precluding use in typical environments without added protection against false switching.

DISCLOSURE OF THE INVENTION

It is a principal object of this invention to provide an improved memery cell.

It is another object of the invention to provide an improved three terminal memory cell employing a tunnel diode device for high speed switching.

It is a further object of the invention to provide a tunnel diode and transistor memory device wherein the current through the associated transistor is maintained constant so that the associated transistor does not switch on and off as the memory changes state, thus avoiding memory cell speed degradation due to transistor switching lag.

It is still a further object of the invention to provide a tunnel diode memory device wherein the current in the tunnel diode is maintained constant, at value between the valley current $I_v$ and peak current $I_p$, so that the noise margin of the cell is improved and false switching is prevented, despite the tunnel diode's poor peak to valley ratio.

These and other objects are accomplished by providing a three terminal memory device employing a conventional bipolar transistor and a tunnel diode shunted across the base-collector junction of the bipolar transistor. The tunnel diode is integrally formed with the bipolar transistor thus requiring no additional chip area over a single transistor. Since the tunnel diode is shunted across the base-collector junction, and not the base-emitter junction as in the prior art, the transistor is not switched on and off as the tunnel diode voltage switches between its two stable states. Rather, the associated transistor is always maintained in its on condition regardless of the tunnel diode voltage state. The current in the tunnel diode is also maintained constant at an operating level which is between the tunnel diode peak and valley currents. Preferably, this operating level is midway between the peak and valley currents thus affording maximum noise margins and precluding false switching.

The transistor collector voltage may be monitored in order to read the stored memory state. Since the current in the transistor is constant, the base emitter voltage will likewise be constant and the switching of the tunnel diode between its two stable states will be indicated by a change in the transistor collector voltage.

In a first embodiment, the memory cell includes an upper and lower word line and a single bit line. The upper word line is connected to the base of the bipolar transistor via a resistor, the value of which determines the constant operating current in the tunnel diode and bipolar transistor. A second word line is connected to the emitter of the bipolar transistor. Bit writing and reading is accomplished through a single bit line connected to the collector of the associated transistor via a Schottky diode.

In a second embodiment, a three terminal memory cell employs a single word line for selecting the cell and a pair of bit lines for reading and writing into the cell. The single word line is connected to the emitter of the bipolar transistor. One bit line is connected to the base of the bipolar transistor via a resistor, the value of which determines the constant operating current through the tunnel diode and bipolar transistor. A second bit line is used to sense the collector voltage for reading the memory word.

The basic memory cells described above may be varied to achieve a four terminal memory cell having two bit lines and two word lines. Improvements may be added to the basic cell to provide simpler writing or reading, or enhanced noise margins. In constrast with the prior art, all of the embodiments employ a tunnel diode shunted across the base-collector junction of a bipolar transistor. Consequently, the bipolar transistor is always on, regardless of memory state, thus precluding the relatively slow bipolar transistor from affecting memory cell switching speed. Likewise, in all of the embodiments the current in the tunnel diode is maintained constant so as to preclude degradation of the noise margin of the cell and consequent false switching.

BEST MODE FOR CARRYING OUT THE INVENTION

Figures 2, 3:
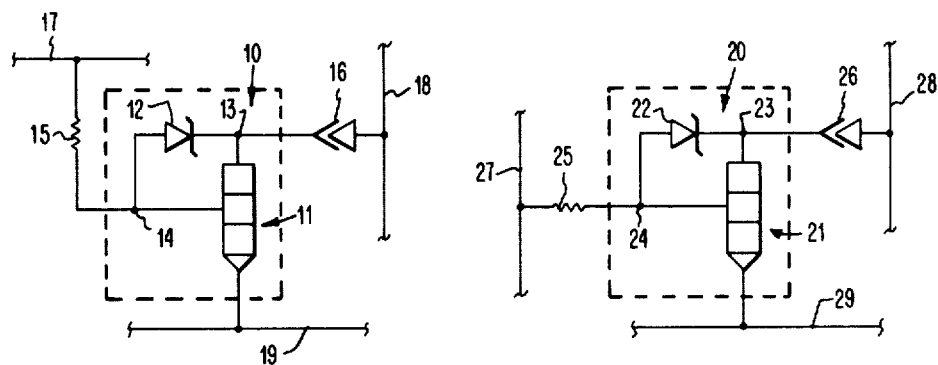
FIG. 2 discloses a first embodiment of a memory cell employing the present invention.
FIG. 3 illustrates a second embodiment of a memory cell employing the present invention.

Referring now to FIG. 2, there is illustrated a first embodiment of a memory cell of the present invention. Memory cell 10 includes an NPN transistor 11, and a tunnel diode 12 shunted across the base-collector junction thereof, with the anode of the tunnel diode being connected to the base at node 14, and the cathode of the tunnel diode being connected to the collector at node 13. Also included is resistor 15 for establishing the operating current level for tunnel diode 12. A Schottky diode 16 is connected to the collector of transistor 11 for sensing the collector voltage, as will be further described below. Connections are also shown from the memory cell to an upper word line 17, a lower word line 19 and a bit line 18. Lines 17, 18 and 19 are commonly found in large scale memory arrays as described below.

Figure 4:
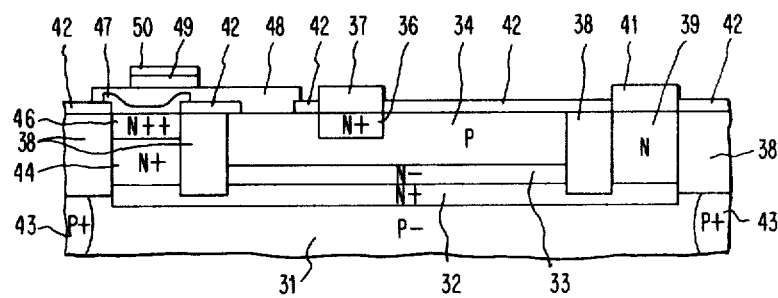
FIG. 4 is a schematic cross section of an integrated circuit embodiment of the memory cell of FIGS. 2 and 3.

FIG. 4 illustrates in cross section form an integrated circuit formed in accordance with the invention to implement the circuit of FIG. 2. From the description which follows it will be seen that tunnel diode 12 integrates with transistor 11 so that the combination does not require additional chip area compared with that of a single transistor, thus contributing to the high density of the present memory cell.

Starting with P− substrate 31, NPN transistor 11 is formed in a conventional manner by forming N+ subcollector 32, P+ subisolation regions 43, N− epitaxial silicon layer 33, recessed oxide isolation regions 38, N+ reach-through region 44, N-epi region 39, P base 34 and N+ emitter regions 36, 46 in accordance with processes well known to those having skill in the semiconductor art. An oxide layer 42 is formed over the surface of the integrated circuit. The oxide layer is selectively removed to expose the desired parts for further processing, e.g., to form the transistor metal contacts and the tunnel diode.

One possible method of forming an integrated tunnel diode across the base-collector junction is as follows: The oxide layer 42 over N+ emitter 46 is removed and the N+ region 46 is further doped, if necessary, for example with arsenic, to form N++ region 46. A thin layer of polysilicon 47 is then deposited on region 46 and doped very heavily with P type dopant (typically boron). The polysilicon is then annealed and recrystallized, for example by laser heating, to form the abrupt N++/P++ junction required for tunneling. The oxide 42 over P base 34, N+ emitter 36 is removed and a metallization layer is formed so that the P++ polysilicon tunnel diode 47 and P base 34 are connected by a metal line 48. N+ emitter metal 37 and N-epi metal 41 are also formed. The metal 41 over N-epi 39 forms a Schottky barrier, as is well known in the art.

In order to employ the tunnel diode/bipolar transistor combination of FIG. 4 as the memory cell of FIG. 2, Schottky metal line 41 is connected to bit line 18, and emitter metal 37 is connected to lower word line 19. Resistor 15 may be formed on metal layer 48 by depositing a doped amorphous silicon layer 49 thereon. Another metal layer 50 may be formed over resistor 49 for connection to upper word line 17. Alternatively, other conventional methods may be employed to introduce an ion implanted resistor between upper word line 17 and base terminal 14.

From the above description it will be seen that the memory cell of the present invention requires no more chip area than that of a single NPN transistor. This sharply contrasts with a conventional memory cell employing at least a cross-coupled transistor pair wherein each transistor is independently formed, in separate isolation regions, and cross-coupled by metallization layers. The memory cell of the present invention requires only a single isolation region having a conventional NPN transistor therein, with the tunnel diode and Schottky diode being formed integrally with the collector of the NPN transistor.

Figure 1:
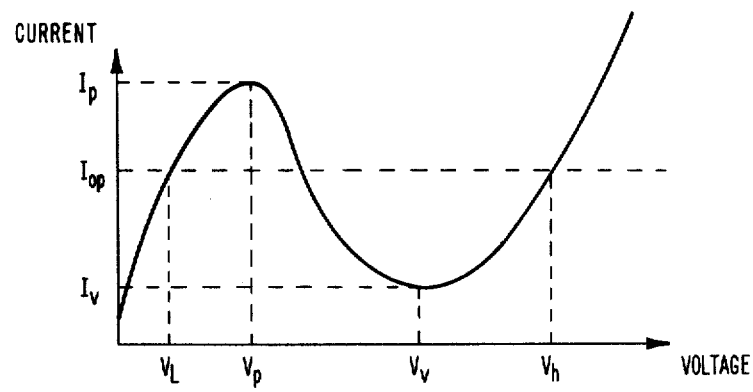
FIG. 1 illustrates the current-voltage characteristics of a typical tunnel diode.

Referring again to FIG. 2, the operation of memory cell illustrated therein will now be described. In the standby state, i.e., when the cell is not subject to a read or write operation, a predetermined voltage differential is maintained across word lines 17 and 19. For example, upper word line 17 may be maintained at +1.2 V and lower word line 19 may be maintained at 0.0 V. Likewise bit line 18 may be maintained at 0.0 V. Transistor 11 conducts so that the base-emitter voltage is about 0.8 V. The voltage drop across resistor 15 is thus 1.2 V−0.8 V or 0.4 V. Resistor 15 is chosen so that the value of the current therethrough equals the desired tunnel diode operating current, $I_{op}$ (see FIG. 1). Preferably the operating current, $I_{op}$, lies midway between the peak current, $I_p$, and valley current, $I_v$, so that the noise margin of the memory cell is maximized.

Since transistor 11 draws negligible current through its base, the current $I_{op}$ through resistor 15 flows entirely through tunnel diode 12 and transistor 11 to lower word line 19. At current $I_{op}$, tunnel diode 12 may exist in either its high voltage state $V_h$ or its low voltage state $V_l$ (see FIG. 1). For illustrative purposes, assume that that $V_h$ corresponds to 0.8 V and $V_l$ corresponds to 0.3 V. Therefore, for a stored ONE, node 13 will be at 0.0 V (tunnel diode 12 in its $V_h$ state), while for stored ZERO, node 13 will be at 0.5 V (tunnel diode 12 in its $V_l$ state). Regardless of the tunnel diode voltage state, transistor 11 is on, and the current through resistor 15, tunnel diode 12 and transistor 11 is a constant value given by $I_{op}$.

The memory cell of FIG. 2 is read by lowering upper word line 17 and lower word line 19 by about 0.5 V. Since both word lines 17 and 19 are lowered by the same voltage, the current through resistor 15, tunnel diode 12 and transistor 11 remains at $I_{op}$. The voltage at node 13 will decrease by about 0.5 V, i.e., node 13 will be at −0.5 V for stored ONE and 0.0 V for stored ZERO. Bit line 18 is then raised by about 0.5 V. For a stored ONE, Schottky diode 16 will have one volt thereacross and will conduct heavily, to supply a large DC sense current in bit line 18. Conversely, for a stored ZERO, the voltage across Schottky diode 16 will be about 0.5 V, which is insufficient to cause Schottky diode 16 to conduct significantly. Bit line 18 will thus have negligible DC current therethrough, thus signifying a stored ZERO. At the end of the read operation, upper and lower word lines 17 and 19, respectively, are again raised by about 0.5 V to their standby voltage levels, and bit line 18 is lowered by about 0.5 V to its standby level.

With regard to the read operation described above, it will be noted that whether the stored data is a ZERO or ONE, the current through resistor 15, tunnel diode 12 and transistor 11 is maintained constant at operating level $I_{op}$ during standby and read operations. Therefore, transistor 11 is not switched between its on and off state, thus maintaining high speed operation. Further, tunnel diode 12 is always maintained at an operating current midway between the peak and valley current, thus maintaining the cell noise margins at their maximum.

It will further be understood by those having skill in the art that word lines 17 and 19 and bit line 18 are connected to adjacent memory cells in a matrix-like structure, and that individual word lines 17, 19 and bit lines 18 are selected by decoder circuitry and driven by line drivers that are a part of the memory array structure. The decoder line driver circuits may be of a simplified nature as they need not be designed to switch current through transistor 11. From the above description, it will be further understood that a memory array employing memory cells of the present invention, operates in a "full select" manner during read, wherein a row of memory cells in the horizontal direction is half selected by decoder circuitry by lowering appropriate upper and lower word lines 17 and 19, respectively, and a column of memory cells in the vertical direction is half selected by the bit decoders by raising the appropriate bit line 18. The memory cell at the intersection of the selected row and column of memory cells will be the only one which is fully selected. Since the tunnel diode of the present invention operates at a constant operating current $I_{op}$, maximizing noise margin, the problem of disturbing the stored data in a cell which is only half-selected is minimized. Half-selected cells, i.e., other memory cells in a selected row or column having only their bit lines or word line selected, will not be read because half selection will be insufficient to trigger a read operation.

The writing into the memory cell of FIG. 2 will now be described. The write operation occurs in all of the cells in the memory array which are connected to a given pair of word lines 17 and 19. Initially, the selected cells are all cleared by turning transistor 11 off, thus cutting off the current in tunnel diode and returning it to its low voltage state. This may be accomplished either by lowering upper word line 17 or raising lower word line 19 by 0.5 V so that the voltage across base emitter junction of transistor 11 is less than its cut off voltage. The current in transistor 11 and tunnel diode 12 is thus reduced to zero. Word lines 17 and 19 are then returned to their standby voltages (i.e., 1.2 V for upper word line 17 and 0.0 V for lower word line 19) so that the tunnel diode 12 is in its low voltage state $V_l$ with current $I_{op}$ flowing through resistor 15, tunnel diode 12 and transistor 11.

In order to preserve ZERO in the cell, bit line 18 is raised to about 0.5 V. Alternatively, if a ONE is to be written into the cell, bit line 18 is held at 0.0 V. The voltage between upper word line 17 and lower word line 19 is then increased by lowering the voltage on lower word line 19, by an amount sufficient to make the current in resistor 15 greater than the peak tunnel diode current $I_p$. For example, if the voltage on lower word line 19 is reduced by 0.5 V to −0.5 V, and there is a 0.8 V drop across the base-emitter junction of transistor 11, then base 14 is at 0.3 V and there is a 0.9 V drop across resistor 15, giving rise to a current larger than current $I_p$ in resistor 15.

With bit line 18 at 0.5 V, node 13 is held sufficiently positive to prevent switch over of the tunnel diode to its high voltage state and a ZERO is thus written into the cell. Conversely, if bit line 18 is maintained at 0.0 V, then node 13 falls to a low voltage and there is a large voltage drop across tunnel diode 12. This voltage drop is sufficient to permit a high current, greater than $I_p$, to flow through tunnel diode 12. Tunnel diode 12 will thus switch over to its high voltage ($V_h$) state. To summarize, if bit line 18 is raised, a ZERO (tunnel diode 12 in its low voltage state, $V_l$) will be written, while if bit line 18 is not raised, tunnel diode 12 will switch to its high voltage state for storing a ONE. After the write operation, the word line voltages are brought back to their normal standby levels, by raising lower word line 19 by 0.5 V. Bit line 18 may then be returned to its normal standby level. It will be obvious to those skilled in the art that although the above description of the write operation only described the lower word line 19 as changing, it may also be necessary or desirable to change the voltage level of upper word line 17 to further facilitate the write operation.

Referring now to FIG. 3, a second embodiment of a three terminal memory cell employing the present invention is illustrated. Operation of the memory cell of FIG. 3 is similar to that of FIG. 2, the principal difference being that the memory cell of FIG. 3 is arranged to operate with a single word line 29 and a pair of bit lines, i.e., write bit line 27 and read bit line 28. As in the case of FIG. 2, the memory cell of FIG. 3 operates with a constant operating current $I_{op}$ through resistor 25, tunnel diode 22 and transistor 21. The value of this current is defined by the size of resistor 25 and is preferably chosen to be midway between tunnel diode peak current $I_p$ and valley current $I_v$. The state of the memory cell is indicated by the voltage at node 23.

In the standby mode, the voltages present in the circuit of FIG. 3 are close to the voltages present in the circuit of FIG. 2, substituting write bit line 27 for upper word line 17. In order to read, the word line is lowered by about 0.5 V, the read bit line is raised by about 0.5 V and the current in read bit line 28 is sensed. A large DC sense circuit indicates a stored ONE and no, or a small, DC sense current indicates a stored ZERO.

The write operation is likewise analogous to the write operation of the circuit of FIG. 2. First, all cells in a given row are cleared, by raising the voltage on word line 29 so as to return channel diode 22 to the low voltage $V_l$ state. The word line voltage is then returned to its normal value. If a ONE is to be written, write bit line 27 is raised by about 0.5 V while if a ZERO is to be written, write bit line 27 is not raised. Word line 29 is then lowered by about 0.5 V, thus switching tunnel diode 22 to high voltage state $V_h$ if the write bit line 27 had been raised by 0.5 V, for storing a ONE. Conversely, if write bit line 27 had not been raised, tunnel diode 22 will remain in its low voltage $V_l$ state, thus storing a ZERO. Word line 29 and write bit line 27 are then brought back to their standby levels.

Figure 5:
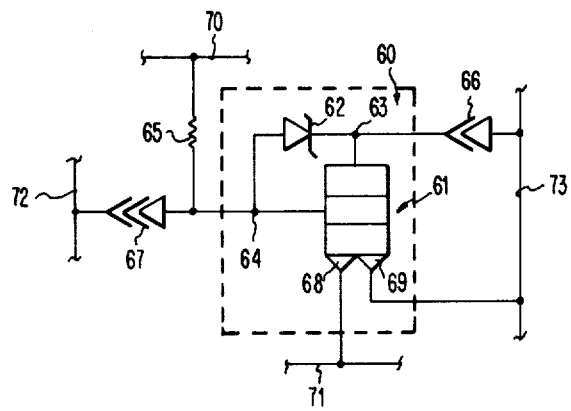
FIG. 5 illustrates a third embodiment of a memory cell employing the present invention.

Referring now to FIG. 5, there is illustrated a third embodiment of a memory cell employing the present invention. The configuration of FIG. 5 eliminates the clear or powering down step in writing into the cell, thus speeding up the write process. Further, this cell is a true "full select" cell, i.e., a single cell can be written into without the need for writing into all the cells in a row as opposed to the cells of FIGS. 2 and 3 wherein all the cells in a row must be written during the write operation. The cell of FIG. 5 requires a pair of word lines and a pair of bit lines.

Referring again to FIG. 5, the memory cell is seen to comprise a NPN transistor 61 having a pair of emitters 68 and 69, and a tunnel diode 62 connected between the base of transistor 61 at node 64, and the collector of transistor 61 at node 63. One emitter 68 of NPN transistor 61 is connected to lower word line 71 while the other emitter 69 is connected to write-ONE bit line 73. A Schottky diode 66 is connected between the collector of transistor 61 and write-ONE bit line 73. Resistor 65 connects node 64 to upper word line 70 while node 64 is connected to write-ZERO bit line 72 by a P-type Schottky diode 67 (i.e., Schottky diode 67 is formed over P-type silicon which is an extension of the base of transistor 61, with a suitable metal such as hefnium as its cathode).

The operation of the memory cell of FIG. 5 will now be described. In standby mode, lower word line 71 is maintained at 0.0 V and upper word line 70 is maintained at 1.2 V. A constant current $I_{op}$ flows through resistor 65, tunnel diode 62 and NPN transistor 61. Write-ZERO bit line 72 is held at +0.5 V and write-ONE bit line 73 is maintained at 0.0 V. In the write operation, upper and lower word lines 70 and 71, respectively, are both raised by 0.5 V. If a ZERO is to be stored, write-ZERO bit line 72 is pulled down by 0.5 V. If a ONE is to be stored, write-ONE bit line 73 is pulled down by 0.5 V. In the read operation, lower word line 71 is lowered by 0.5 V, bit line 73 is raised by 0.5 V and the presence of a large DC sense current in bit line 73 indicates stored ONE, while the presence of negligible DC sense current indicates stored ZERO. It may also be necessary to lower the voltage on upper word line 70 as well as lower word line 71 during the read operation.

From the above description of the write operation, it will be seen that the addition of Schottky diode 66 and extra emitter 69 renders the powering down or clearing step described in connection with FIGS. 2 and 3 unnecessary. The write operation is thus simpler and faster. Further, it will be noted that full cell selection is accomplished, i.e., a single cell in an array may be independently read or written into.

Figure 6:
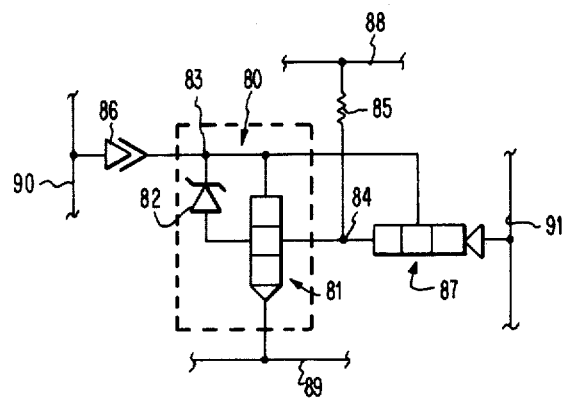
FIG. 6 illustrates a fourth embodiment of a memory cell employing the present invention.

Referring now to FIG. 6, another embodiment of a memory cell employing the present invention is illustrated. As in previously described embodiments, a tunnel diode 82 is shunted across the base-collector terminals of an NPN transistor 81. A resistor 85 is connected between upper word line 88 and the base of transistor 81. In the present embodiment a lateral PNP transistor is used for simplifying the read/write operation and for improving the cell noise margins. The collector of lateral PNP transistor 87 is connected to the base of NPN transistor 81 at node 84 while the base of lateral PNP transistor 87 is connected to the collector of NPN transistor 81 at node 83. The emitter of lateral PNP 87 is connected to write-ONE bit line 91. Finally, the emitter of transistor 81 is connected to lower word line 89, and a diode 86, which may be a Schottky diode, is connected between the collector of transistor 81 and write-ZERO bit line 90.

Operations of the circuit of FIG. 6 is as follows: At standby, lower word line 89 is maintained at 0.0 V while upper word line 88 is maintained at +1.2 V. Bit lines 90 and 91 are maintained at 0.0 V. In the read operation, lower word line 89 is lowered by about 0.5 V, bit line 91 is raised by about 0.5 V, and the current in bit line 91 is sensed as in previous embodiments. In the write operation, word lines 88 and 89 are both lowered by about 0.5 V. This lowers the collector of transistor 81 and the base of transistor 87 by a like amount. To write ZERO, the write-ZERO bit line 90 is raised by about 0.5 V forcing tunnel diode 82 into its low voltage state. To write ONE, the write-ONE bit line 91 is raised by 0.5 V causing lateral PNP to conduct, which in turn draws more current through NPN 81 by the well known SCR effect. The extra current through 81 forces tunnel diode 82 into its high voltage state. From the above description, it will be seen that write operation occurs quite rapidly due to the amplification provided by lateral PNP transistor 87.

Figure 7:
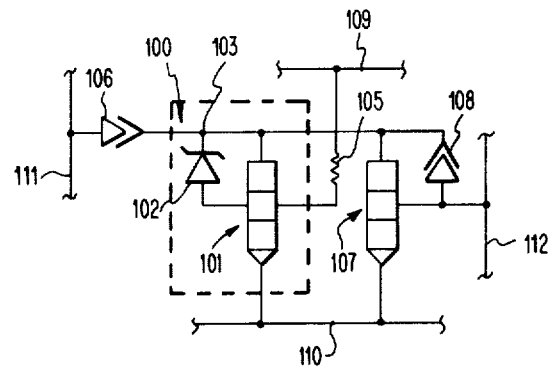
FIG. 7 illustrates a fifth embodiment of a memory cell employing the present invention.

Referring now to FIG. 7, a final embodiment of a memory cell employing the present invention is illustrated. The embodiment of FIG. 7 employs a conventional NPN transistor 107, clamped by Schottky diode 108 in a memory cell comprising NPN transistor 101 and tunnel diode 102 connected between the base and collector thereof. Resistor 105, for setting the operating current level of the tunnel diode, is connected to upper word line 109 and the base of transistor 101. Schottky diode 106 connects the collector of transistor 101 with write-ZERO bit line 111, while write-ONE bit line 112 is connected to the base of transistor 107. Lower word line 110 is connected to the emitters of transistors 101 and 107.

The operation of the memory cell of FIG. 7 will now be described. As with all previous embodiments, in standby mode, a voltage differential of about 1.2 V is maintained between upper word line 109 and lower word line 110, while bit lines 111 and 112 are maintained at 0.0 V. In the write operation, both word lines are lowered by about 0.5 V. To write a ZERO, the write-ZERO bit line 111 is pulled up by about 0.5 V, thus raising the collector of transistor 101, and forcing tunnel diode 102 to its low voltage state. To write a ONE, the write-ONE bit line 112 is pulled up by 0.5 V to turn on transistor 107, thus drawing high current through tunnel diode 102, and switching it to its high voltage state. As in previous embodiments, the read operation occurs by pulling down lower word line 110, pulling up bit line 111, and sensing the DC current therein. Note that when the lower word line is pulled down during read, the upper word line may also have to be pulled down, at least partially.

Variations in the above described embodiments will be apparent to those having skill in the art. For a given set of memory specifications, including voltage level requirements, noise margins, and speed and density requirements, a memory cell employing the present invention may be constructed. It will also be understood by those having skill in the art that the voltages employed in describing the operation of the memory cells in FIGS. 2-7 were for illustrative purposes only, and that actual voltages will be a function of a particular memory architecture, device characteristics, etc.

Whereas I have illustrated and described the preferred embodiment of my invention, it is to be understood that I do not limit myself to the precise constructions herein disclosed and the right is reserved to all changes and modifications coming within the scope of the invention as defined in the appended claims.

I claim:

1. A two state memory cell comprising:
   a first bipolar transistor having a base, an emitter and a collector;
   a tunnel diode shunted across the base-collector junction of said first bipolar transistor, the anode of said tunnel diode being connected to said base, and the cathode of said tunnel diode being connected to said collector;
   means for maintaining the voltage across said tunnel diode at either of two distinct values, corresponding to said two memory cell states; and,
   means for monitoring the voltage across said tunnel diode.

2. The memory cell of claim 1 wherein said voltage monitoring means comprises a diode, the cathode of which is connected to the cathode of said tunnel diode and the anode of which is maintained at a predetermined voltage, the voltage differential across said diode being sufficiently large to forward bias said diode when the voltage across said tunnel diode is at one of said two distinct values, to thereby cause current to flow through said diode.

3. A two state memory cell comprising:
   a first bipolar transistor having a base, an emitter and a collector;
   a tunnel diode shunted across the base-collector junction of said first bipolar transistor, the anode of said tunnel diode being connected to said base, and the cathode of said tunnel diode being connected to said collector;
   means for maintaining the voltage across said tunnel diode at either of two distinct values, corresponding to said two memory cell states; and,
   means for establishing an operating current in said tunnel diode and in said first bipolar transistor connected thereto, said operating current being larger than the tunnel diode valley current and smaller than the tunnel diode peak current;
   whereby the voltage across said tunnel diode is maintained at either of said two distinct values, corresponding to said two memory cell states, while said first bipolar transistor is maintained in its on condition by said operating current, regardless of the voltage across said tunnel diode.

4. The memory cell of claim 3 wherein said operating current establishing means comprises a resistor, one terminal of which is connected to the anode of said tunnel diode, and the other terminal of which is maintained at a predetermined voltage, the magnitude of said predetermined voltage and the size of said resistor being such that an operating current larger than the tunnel diode valley current and smaller than the tunnel diode peak current is established in said tunnel diode.

5. The memory cell of claim 3 wherein said operating current has a value halfway between that of the tunnel diode valley current and peak current, whereby the memory cell noise margins are maximized.

6. The memory cell of claim 3 further comprising means for switching the voltage across said tunnel diode from the lower to the higher one of said two distinct values.

7. The memory cell of claim 6 wherein said voltage switching means comprises means for increasing the current through said tunnel diode from said operating current level to a level greater than the tunnel diode peak current.

8. The memory cell of claim 3 further comprising means for switching the voltage across said tunnel diode from the higher to the lower of said two distinct values.

9. The memory cell of claim 8 wherein said voltage switching means comprises means for reducing the current through said tunnel diode to zero whereby when said operating current is restored, the voltage across said tunnel diode will be at the lower of said two distinct values.

10. A two state memory cell comprising:
    a first bipolar transistor having a base, an emitter and a collector;
    a tunnel diode shunted across the base-collector junction of said first bipolar transistor, the anode of said tunnel diode being connected to said base, and the cathode of said tunnel diode being connected to said collector; and,
    means for maintaining the voltage across said tunnel diode at either of two distinct values, corresponding to said two memory cell states;

wherein said first bipolar transistor is an NPN transistor, wherein said tunnel diode comprises a heavily doped N++ layer on said collector, and a heavily doped P++ layer on said heavily doped N++ layer, and wherein said memory cell further includes a metallization layer for connecting said heavily doped P++ layer to said base.

11. A two state memory cell comprising:

a first bipolar transistor having a base, an emitter and a collector;

a tunnel diode shunted across the base-collector junction of said first bipolar transistor, the anode of said tunnel diode being connected to said base, and the cathode of said tunnel diode being connected to said collector; and, means for maintaining the voltage across said tunnel diode at either of two distinct values, corresponding to said two memory cell states;

wherein said first bipolar transistor includes a second emitter, and wherein said memory cell further includes a Schottky diode, the cathode of which is connected to the cathode of said tunnel diode and the anode of which is connected to said second emitter, for switching said tunnel diode from the higher to the lower of said two distinct voltage values.

12. A two state memory cell comprising:

a first bipolar transistor having a base, an emitter and a collector;

a tunnel diode shunted across the base-collector junction of said first bipolar transistor, the anode of said tunnel diode being connected to said base, and the cathode of said tunnel diode being connected to said collector;

means for maintaining the voltage across said tunnel diode at either of two distinct values, corresponding to said two memory cell states; and, a second bipolar transistor, the base of which is connected to the collector of said first bipolar transistor, the collector of which is connected to the base of said first bipolar transistor and the emitter of which is connected to a predetermined voltage source, for switching said tunnel diode from the lower to the higher of said two distinct voltage values.

13. A two state memory cell comprising:

a first bipolar transistor having a base, an emitter and a collector;

a tunnel diode shunted across the base-collector junction of said first bipolar transistor, the anode of said tunnel diode being connected to said base, and the cathode of said tunnel diode being connected to said collector;

means for maintaining the voltage across said tunnel diode at either of two distinct values, corresponding to said two memory cell states; and, a second bipolar transistor, the collector of which is connected to the collector of said first bipolar transistor, the emitter of which is connected to the emitter of said first bipolar transistor and the base of which is connected to a predetermined voltage source, for switching said tunnel diode from the lower to the higher of said two distinct voltage values.

* * * * *